US010260961B2

(12) United States Patent
Ferguson et al.

(10) Patent No.: US 10,260,961 B2
(45) Date of Patent: Apr. 16, 2019

(54) INTEGRATED CIRCUIT PACKAGES WITH TEMPERATURE SENSOR TRACES

(71) Applicant: Intel Corporation, Santa Clara, CA (US)

(72) Inventors: Shelby Ferguson, Lacey, WA (US);
Rashelle Yee, Puyallup, WA (US);
Russell S. Aoki, Tacoma, WA (US);
Michael Hui, Tacoma, WA (US);
Jonathon Robert Carstens, Lacey, WA (US); Joseph J. Jasniewski, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 521 days.

(21) Appl. No.: 14/975,938

(22) Filed: Dec. 21, 2015

(65) Prior Publication Data

US 2017/0176260 A1      Jun. 22, 2017

(51) Int. Cl.
*G01K 7/00* (2006.01)
*G01K 1/00* (2006.01)
(Continued)

(52) U.S. Cl.
CPC .............. *G01K 7/16* (2013.01); *H01L 23/34* (2013.01); *H01L 23/345* (2013.01); *H01L 24/81* (2013.01); *H01L 23/3128* (2013.01); *H01L 23/473* (2013.01); *H01L 24/13* (2013.01); *H01L 24/16* (2013.01); *H01L 24/32* (2013.01); *H01L 24/48* (2013.01); *H01L 24/73* (2013.01); *H01L 24/92* (2013.01); *H01L 25/0655* (2013.01); *H01L 2223/6677* (2013.01); *H01L 2224/0401* (2013.01); *H01L 2224/131* (2013.01); *H01L 2224/16227* (2013.01);
(Continued)

(58) Field of Classification Search
USPC ......................................... 374/185, 178, 141
See application file for complete search history.

(56) References Cited

U.S. PATENT DOCUMENTS 4,434,321 A    2/1984   Betts
4,481,403 A    11/1984  Monte
(Continued)

FOREIGN PATENT DOCUMENTS

JP    05175659    7/1993
JP    06291165    10/1994
(Continued)

OTHER PUBLICATIONS

USPTO Non-Final Office Action issued in U.S. Appl. No. 14/975,943 dated Dec. 13, 2017, 39 pages.
(Continued)

*Primary Examiner* — Mirellys Jagan
(74) *Attorney, Agent, or Firm* — Patent Capital Group

(57) ABSTRACT

Disclosed herein are integrated circuit (IC) packages with temperature sensor traces, and related systems, devices, and methods. In some embodiments, an IC package may include a package substrate and an IC die disposed on the package substrate, wherein the package substrate includes a temperature sensor trace, and an electrical resistance of the temperature sensor trace is representative of an equivalent temperature of the temperature sensor trace.

25 Claims, 7 Drawing Sheets

(51) Int. Cl.
*G01K 7/16* (2006.01)
*H01L 23/34* (2006.01)
*H01L 23/00* (2006.01)
*H01L 23/31* (2006.01)
*H01L 23/473* (2006.01)
*H01L 25/065* (2006.01)

(52) U.S. Cl.
CPC .......... *H01L 2224/32225* (2013.01); *H01L 2224/48227* (2013.01); *H01L 2224/73204* (2013.01); *H01L 2224/73253* (2013.01); *H01L 2224/81139* (2013.01); *H01L 2224/81193* (2013.01); *H01L 2224/81234* (2013.01); *H01L 2224/81815* (2013.01); *H01L 2224/81908* (2013.01); *H01L 2224/92125* (2013.01); *H01L 2924/00014* (2013.01); *H01L 2924/10253* (2013.01); *H01L 2924/1432* (2013.01); *H01L 2924/1434* (2013.01); *H01L 2924/157* (2013.01); *H01L 2924/1579* (2013.01); *H01L 2924/15311* (2013.01); *H01L 2924/15787* (2013.01); *H01L 2924/16251* (2013.01); *H01L 2924/19041* (2013.01); *H01L 2924/19042* (2013.01); *H01L 2924/19043* (2013.01); *H01L 2924/19105* (2013.01)

(56) References Cited

U.S. PATENT DOCUMENTS

| | | | |
|---|---|---|---|
| 4,730,238 | A | 3/1988 | Cook |
| 5,220,491 | A | 6/1993 | Sugano et al. |
| 5,513,076 | A | 4/1996 | Werther |
| 5,539,186 | A | 7/1996 | Abrami et al. |
| 5,615,477 | A | 4/1997 | Sweitzer |
| 5,622,770 | A | 4/1997 | Dowdy et al. |
| 5,965,944 | A | 10/1999 | Frankoski et al. |
| 6,002,168 | A | 12/1999 | Bellaar et al. |
| 6,181,004 | B1 | 1/2001 | Koontz et al. |
| 6,396,706 | B1 | 5/2002 | Wohlfarth |
| 7,474,540 | B1 | 1/2009 | Dang et al. |
| 7,511,228 | B2 | 3/2009 | Yaung et al. |
| 8,411,442 | B2 | 4/2013 | Meinel et al. |
| 8,519,304 | B2 | 8/2013 | Bartley et al. |
| 8,981,259 | B2 | 3/2015 | Chou |
| 9,012,811 | B2 | 4/2015 | White |
| 9,468,089 | B2 | 10/2016 | Sasaki et al. |
| 2004/0195701 | A1 | 10/2004 | Attarwala |
| 2004/0232535 | A1 | 11/2004 | Tarn |
| 2006/0065431 | A1 | 3/2006 | Trucco |
| 2006/0091509 | A1* | 5/2006 | Zhao .......... H01L 23/04 257/678 |
| 2006/0231541 | A1 | 10/2006 | Takada et al. |
| 2007/0296071 | A1 | 12/2007 | Chiu et al. |
| 2009/0285261 | A1* | 11/2009 | Casey .......... G01K 1/026 374/178 |
| 2011/0237001 | A1 | 9/2011 | Hasebe et al. |
| 2012/0199830 | A1 | 8/2012 | Raravikar et al. |
| 2014/0307406 | A1 | 10/2014 | Kitajima |
| 2015/0016083 | A1 | 1/2015 | Nootens et al. |
| 2015/0114707 | A1 | 4/2015 | Glickman |
| 2015/0235986 | A1 | 8/2015 | Interrante et al. |
| 2016/0351526 | A1 | 12/2016 | Boyd et al. |
| 2017/0178994 | A1 | 6/2017 | Hui et al. |
| 2017/0181271 | A1 | 6/2017 | Yee et al. |
| 2018/0174940 | A1* | 6/2018 | Ferguson .......... H01L 23/345 |

FOREIGN PATENT DOCUMENTS

| | | |
|---|---|---|
| JP | 08330686 A | 12/1996 |
| JP | 10041606 | 2/1998 |
| JP | 2003106896 | 4/2003 |
| JP | 2011044512 | 3/2011 |
| JP | 2012160602 | 8/2012 |
| WO | 2015152855 A1 | 10/2015 |
| WO | 2017112134 A1 | 6/2017 |
| WO | 2017112135 A1 | 6/2017 |
| WO | 2017112136 A1 | 6/2017 |

OTHER PUBLICATIONS

USPTO Non-Final Office Action issued in U.S. Appl. No. 14/975,941 dated Jul. 3, 2017; 38 pages.
International Search Report and Written Opinion issued in PCT Application No. PCT/US2016/062117 dated Feb. 28, 2017; 11 pages.
International Search Report and Written Opinion issued in PCT Application No. PCT/US2016/062143 dated Feb. 15, 2017; 10 pages.
International Search Report and Written Opinion issued in PCT Application No. PCT/US2016-062146 dated Feb. 28, 2017; 11 pages.
U.S. Appl. No. 14/975,532 entitled "Semiconductor Package Alignment Frame for Local Reflow", filed Dec. 18, 2015, 79 pages.
U.S. Appl. No. 14/975,941 entitled "Warpage Mitigation in Printed Circuit Board Assemblies," filed Dec. 21, 2015, 35 pages.
U.S. Appl. No. 14/975,943 entitled "Integrated Circuit Package Support Structures," filed Dec. 21, 2015, 61 pages.
USPTO Final Rejection issued in U.S. Appl. No. 14/975,941 dated Oct. 20, 2017; 26 pages.
USPTO Final Office Action issued in U.S. Appl. No. 14/975,943 dated Jul. 12, 2018, 16 pages.
USPTO Nonfinal Rejection issued in U.S. Appl. No. 14/975,941 dated Apr. 25, 2018; 21 pages.
USPTO Notice of Allowance in U.S. Appl. No. 14/975,941 dated Sep. 5, 2018; 16 pages.

* cited by examiner

INTEGRATED CIRCUIT PACKAGES WITH TEMPERATURE SENSOR TRACES

TECHNICAL FIELD

The present disclosure relates generally to integrated circuit (IC) packages, and more particularly, to IC packages with temperature sensor traces.

BACKGROUND

Integrated circuit (IC) packages often include computing components (e.g., processing devices) that generate significant heat during operation. This heat is typically managed by heat sinks and other heat dissipation devices, and by restricting the performance of the computing component to stay within a temperature range of reliable operation.

BRIEF DESCRIPTION OF THE DRAWINGS

Embodiments will be readily understood by the following detailed description in conjunction with the accompanying drawings. Embodiments are illustrated by way of example, and not by way of limitation, in the figures of the accompanying drawings.

DETAILED DESCRIPTION

Figure 1:
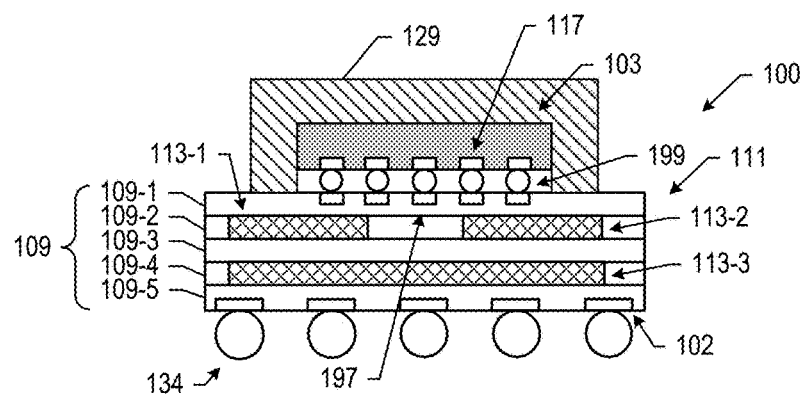
FIG. 1 is a side cross-sectional view of an integrated circuit (IC) package including temperature sensor traces, in accordance with various embodiments.

Disclosed herein are integrated circuit (IC) packages with temperature sensor traces, and related systems, devices, and methods. For example, in some embodiments, an IC package may include a package substrate and an IC die disposed on the package substrate, wherein the package substrate includes a temperature sensor trace, and an electrical resistance of the temperature sensor trace is representative of an equivalent temperature of the temperature sensor trace.

Various ones of the embodiments disclosed herein may provide improved temperature monitoring for IC packages, enabling more intelligent thermal control and better computing performance. In some IC designs, thermal constraints may be imposed on device operation to ensure the predicted performance of semiconductor materials (e.g., silicon) and package materials. The conventional approach to temperature monitoring in an IC package is to use the readout from a single digital temperature sensor (DTS) at the top center of a silicon die. This conventional approach provides a limited picture of the temperature profile of the entire IC package, and relying on the single temperature readout may lead to suboptimal device performance. For example, some thermal control systems may perform an emergency shutdown of an IC die if the temperature exceeds a given level; however, having only a single temperature measurement may not accurately represent the temperature in multiple relevant locations in an IC package, and the conventional approach may result in an IC die being shut down prematurely to avoid failure (e.g., when other areas of the die are not experiencing the same high temperature as the area near the single DTS).

Various ones of the embodiments disclosed herein may enable the monitoring of temperature in an IC package with greater resolution and/or with more flexibility in the location of the temperature sensors. In some embodiments, multiple areas of an IC package (e.g., a central processing unit (CPU) package) may be monitored simultaneously by temperature sensor traces on the internal package layers. The temperature data generated by these temperature sensor traces may be used to develop package temperature maps that can be used in further package design iterations and/or for thermal control. For example, having a higher resolution picture of the temperature profile of an IC package may increase the thermal margin and reduce the likelihood of an emergency shutdown when it is not truly helpful. Moreover, the in-package temperature sensor traces disclosed herein may be readily formed during existing IC package substrate manufacturing operations and may provide a more efficient temperature monitoring solution than the use of multiple DTSs, each of which may require its own supporting circuitry and occupy valuable space.

In the following detailed description, reference is made to the accompanying drawings that form a part hereof, wherein like numerals designate like parts throughout, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

Various operations may be described as multiple discrete actions or operations in turn, in a manner that is most helpful in understanding the disclosed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale.

FIG. 1 is a side cross-sectional view of an IC package 100 including temperature sensor traces 113-1, 113-2, and 113-3, in accordance with various embodiments. In particular, the IC package 100 includes a package substrate 111, an IC die 103 disposed on the package substrate 111, and the temperature sensor traces 113 are included in the package substrate 111. The specific number of temperature sensor traces 113 shown in FIG. 1 is simply illustrative, and more or fewer temperature sensor traces 113 may be included in an IC package 100. Additionally, the specific arrangement of temperature sensor traces 113 shown in FIG. 1 is simply illustrative, and any suitable arrangement may be used.

Each temperature sensor trace 113 may be formed of an electrically conductive material (e.g., a metal, such as copper) whose electrical resistance changes as a function of the equivalent temperature of the temperature sensor trace 113. As used herein, the "equivalent temperature" may represent a weighted average of the temperature of a temperature sensor trace 113; for example, if 90% of the length of a constant width temperature sensor trace 113 is 10° and the remaining 10% of the length of the temperature sensor trace 113 is 20°, the equivalent temperature for the temperature sensor trace 113 may be 11°. The function relating electrical resistance and equivalent temperature may be given by:

$$R = R\text{ref}(1 - \alpha(T - T\text{ref}))$$

where R is the electrical resistance of the temperature sensor trace 113 at the equivalent temperature T, Rref is a reference electrical resistance of the temperature sensor trace 113 at a reference temperature Tref, and $\alpha$ is the temperature coefficient of resistance for the material forming the temperature sensor trace 113. The values of $\alpha$, Rref, and Tref may be experimentally determined or may be known in the art, and are accordingly not discussed further herein. When $\alpha$, Rref, and Tref are known for a particular temperature sensor trace 113, a measurement of the electrical resistance R of the temperature sensor trace 113 may enable the equivalent temperature T of the temperature sensor trace 113 to be determined in accordance with the above function. The values of $\alpha$, Rref, and Tref may be stored in a memory device (e.g., in a lookup table) and may be accessed as desired. In some embodiments, functions other than the function given above may more accurately describe the relationship between electrical resistance R and equivalent temperature T of a temperature sensor trace 113 (e.g., as determined experimentally); in such embodiments, the parameters of the more accurate function may be stored in a memory device (e.g., in a lookup table) and used to determine the equivalent temperature T based on the electrical resistance R.

Conductive contacts 117 (e.g., lands or pads) on the IC die 103 may electrically couple the IC die 103 to conductive contacts 197 on the package substrate 111. In the embodiment illustrated in FIG. 1, solder 199 may be used to electrically couple the conductive contacts 117 to the conductive contacts 197 (e.g., in a flip chip arrangement). An underfill material (not shown) may be disposed between the IC die 103 and the package substrate 111, as known in the art. In other embodiments, the IC die 103 may be wire bonded, or otherwise electrically coupled, to the package substrate 111.

The package substrate 111 may include multiple layers 109. One or more of these layers 109 may include one or more temperature sensor traces 113. For example, in the embodiment illustrated in FIG. 1, the layer 109-2 includes two temperature sensor traces 113-1 and 113-2, and the layer 109-4 includes one temperature sensor trace 113-3. Different layers including temperature sensor traces 113 may be spaced apart by insulator layers (e.g., the layer 109-3 of FIG. 1). Some of the layers 109 may be metal layers that include electrical signal routing traces, and some of the layers 109 may be insulator layers (e.g., formed of a dielectric material) that include vias to electrically couple different metal layers, as known in the art. For example, the layer 109-1 may be an insulator layer that includes vias (not shown) to route electrical signals to/from the conductive contacts 197, and the layer 109-5 may be an insulator layer that includes vias (not shown) to route electrical signals to/from conductive contacts 102. In particular, the electrical signal routing traces and vias may be arranged to route electrical signals between the conductive contacts 197 and the conductive contacts 102 (with the signals routed from the conductive contacts 102 to other electrical components, such as a PCB, as discussed below with reference to FIGS. 5-9). Electrical signal routing traces and vias are not shown in FIG. 1 for ease of illustration, and may be formed in accordance with any technique known in the art. In some embodiments, the package substrate 111 may include multiple metal layers separated from one another by layers of dielectric material and interconnected by electrically conductive vias. Any one or more of the metal layers may be formed in a desired circuit pattern of signal routing traces to route electrical signals (optionally in conjunction with other metal layers) between the components of the package substrate 111. In some embodiments, a layer 109 of the package substrate 111 may include both electrical signal routing traces and one or more temperature sensor traces 113, while in other embodiments, electrical signal routing traces and temperature sensor traces 113 may be segregated in different layers 109. In some embodiments, a layer 109 of the package substrate 111 may include both vias and one or more temperature sensor traces 113 (e.g., as discussed below with reference to FIG. 4).

In embodiments in which the IC package 100 is a ball grid array (BGA) package, solder balls 134 may be disposed on the conductive contacts 102 of the package substrate 111. The solder balls 134 may be used to couple the package substrate 111 to another component, such as the IC package support structure 106 discussed below with reference to FIGS. 5-9, a printed circuit board (PCB) (e.g., a motherboard), an interposer, or any other suitable component.

Figure 10:
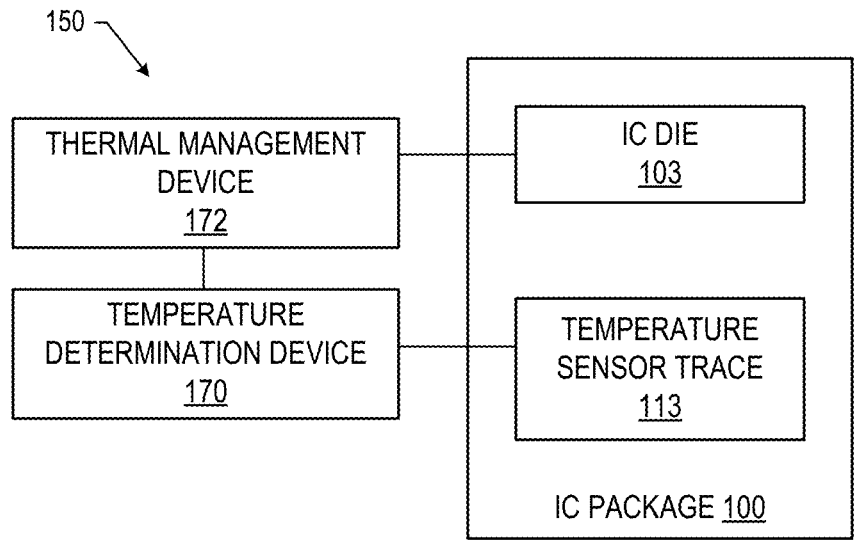
FIG. 10 is a block diagram of an IC package temperature monitoring system, in accordance with various embodiments.

In some embodiments, the temperature sensor traces 113 may have connection terminals (not shown) exposed at a surface of the package substrate 111 at which a temperature determination device 170 (discussed below with reference to the IC package temperature monitoring system 150 of FIG. 10) may make electrical contact to the temperature sensor traces 113 to measure their electrical resistance and determine their equivalent temperatures. In some embodiments, the connection terminals of the temperature sensor traces 113 may be coupled to the conductive contacts 197, and the temperature determination device 170 may be included in the IC die 103. In some embodiments, the connection terminals of the temperature sensor traces 113 may be coupled to the conductive contacts 102, and the temperature determination device 170 may be included in a component coupled to the conductive contacts 102 (e.g., the IC package support structure 106 of FIG. 5). In some embodiments, the connection terminals of the temperature sensor traces 113 may be coupled to their own contact pads on a surface of the package substrate 111, separate from the conductive contacts 197 and the conductive contacts 102. In such embodiments, the inclusion of additional sensor traces 113 may incur the "expense" of additional area for connection terminals.

The IC die 103 may include any suitable computing component, such as a central processing unit (CPU), graphics processing unit (GPU), platform controller hub (PCH), any other processing device, a memory device, passive components, or any combination of computing components. For example, the IC die 103 may include any suitable ones of the components discussed below with reference to the computing device 500 of FIG. 13.

The IC package 100 of FIG. 1 also includes a heat spreader 129 in thermal contact with the IC die 103. A thermal interface material (TIM), such as a thermally conductive paste, may be disposed between the IC die 103 and the heat spreader 129. In some embodiments, the heat spreader 129 may be coupled to the package substrate 111 (e.g., via an adhesive). Further thermal management components, such as a heat sink or a liquid cooling system (not shown), may also be coupled to the IC package 100. In some embodiments, no heat spreader 129 may be included. In some embodiments, the IC die 103 may be embedded in a mold material.

Figure 2:
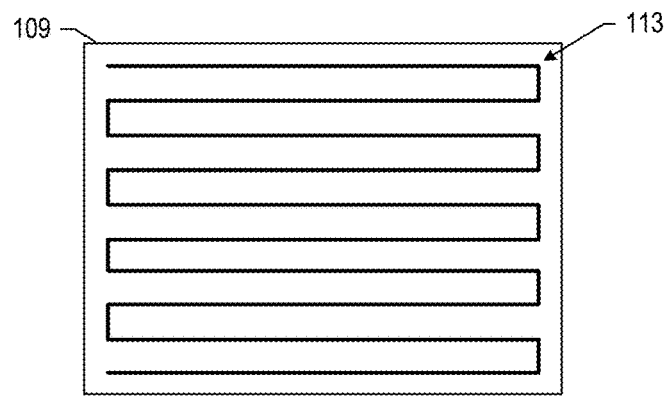
FIG. 2 is a top view of an example of a temperature sensor trace in a layer of a package substrate, in accordance with various embodiments.
Figure 3:
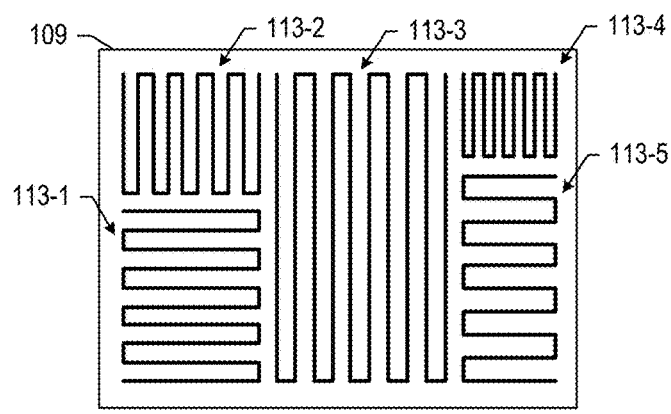
FIG. 3 is a top view of an example of multiple temperature sensor traces in a layer of a package substrate, in accordance with various embodiments.
Figure 4:
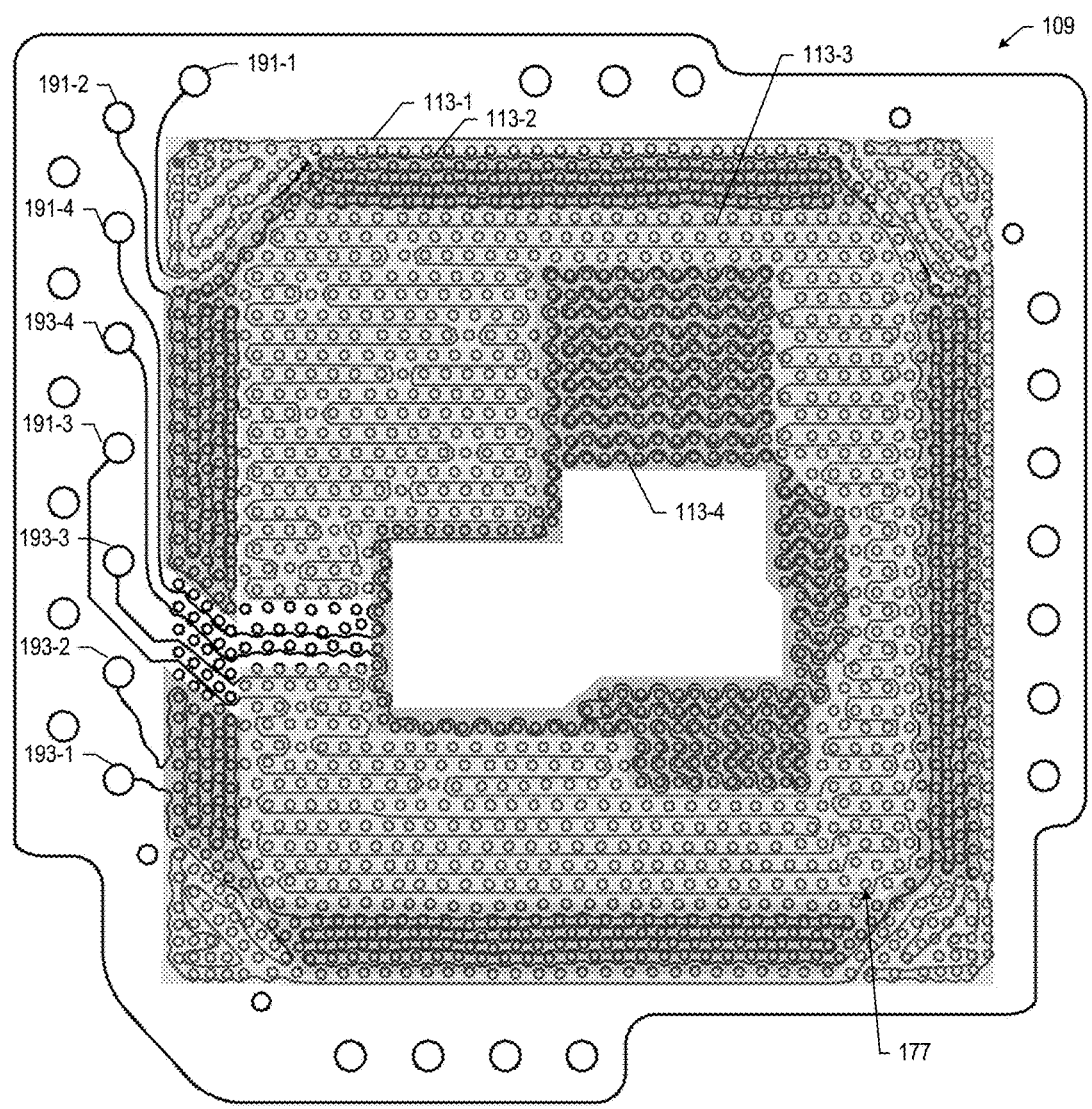
FIG. 4 is a top view of another example of multiple temperature sensor traces in a layer of a package substrate, in accordance with various embodiments.

A temperature sensor trace 113 included in a package substrate 111 of an IC package 100 may be arranged in any desired pattern. FIGS. 2-4 illustrate various examples of arrangements of temperature sensor traces 113. FIG. 2 is a top view of an example of a temperature sensor trace 113 in a layer 109 of a package substrate 111, in accordance with various embodiments. The temperature sensor trace 113 of FIG. 2 is arranged in a serpentine pattern across substantially all of the area of the layer 109, and thus the equivalent temperature of the temperature sensor trace 113 of FIG. 2 may represent an equivalent temperature of the layer 109 across its area.

FIG. 3 is a top view of an example of multiple temperature sensor traces 113 in a layer 109 of a package substrate 111, in accordance with various embodiments. In particular, the temperature sensor traces 113-1, 113-2, 113-3, 113-4, and 113-5 of the embodiment of FIG. 3 each have a serpentine arrangement, but with different densities and covering different portions of the area of the layer 109. Independently monitoring each of the temperature sensor traces 113 in the embodiment of FIG. 3 may enable the determination of the equivalent temperature of the layer 109 in each of the corresponding portions of the area of the layer 109, thereby determining the temperature profile of the layer 109 with greater resolution than could be achieved with a single temperature sensor trace 113. Each of the temperature sensor traces 113 of the embodiment of FIG. 3 may correspond to a particular area of interest in the package substrate 111 (e.g., an area in the shadow of a particular component in the IC die 103). In some embodiments, different temperature sensor traces 113 may correspond to different sets of pins corresponding to different package features. For example, a set of pins corresponding to a high power package feature may be monitored by one temperature sensor trace 113, while a set of pins corresponding to another feature may be monitored by a different temperature sensor trace 113.

FIG. 4 is a top view of another example of multiple temperature sensor traces 113 in a layer 109 of a package substrate 111, in accordance with various embodiments. The footprints of each of the different temperature sensor traces 113 in FIG. 4 are shaded to aid the reader. In particular, FIG. 4 illustrates temperature sensor traces 113-1, 113-2, 113-3, and 113-4 arranged around different vias 177 in the layer 109. Each of the temperature sensor traces 113-1, 113-2, 113-3, and 113-4 may be arranged to monitor a different region of the layer 109. For example, the temperature sensor trace 113-1 may be arranged largely proximate to the corners of the layer 109, and thus the resistance of the temperature sensor trace 113-1 may be representative of the equivalent temperature of the corners of the layer 109. The temperature sensor trace 113-2 may be arranged largely proximate to the edges of the layer 109, and thus the resistance of the temperature sensor trace 113-2 may be presented above the equivalent temperature of the edges of the layer 109. In some embodiments, the temperature sensor trace 113-3 may be monitoring a power delivery section of the IC package 100, while the temperature sensor trace 114-4 may be monitoring the equivalent die temperature. Generally, temperature sensor traces 113 may be arranged as a function of temperature interest area, and their layout may depend on which regions of the IC package 100 are of interest for temperature monitoring purposes (e.g., when different regions of the IC package 100 have different thermal "trip points" for operation).

Each of the temperature sensor traces 113 in the embodiment of FIG. 4 may include a first connection terminal 191 and a second connection terminal 193. These connection terminals are shown as pads disposed at the leftmost edge of the layer 109 in FIG. 4. As discussed above, a temperature determination device (e.g., the temperature determination device 170 of FIG. 10) may be coupled to the connection terminals 191 and 193 of a temperature sensor trace 113 and may measure the resistance of the temperature sensor trace 113 between the connection terminals 191 and 193 as part of an equivalent temperature determination.

In some embodiments, the IC packages 100 disclosed herein (including one or more temperature sensor traces 113 included in the package substrate 111) may be disposed on an IC package support structure that includes heater traces for readily coupling and uncoupling the IC packages 100 from the IC package support structure. In particular, such IC package support structures may facilitate a local reflow temperature for the attachment/detachment of BGA IC packages. FIGS. 5-9 illustrate such embodiments.

Figure 5:
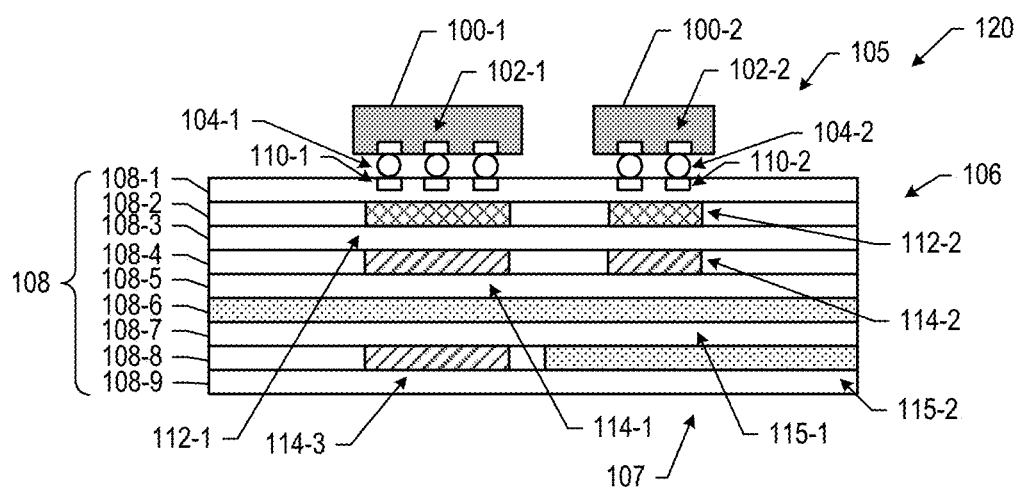
FIG. 5 is a side cross-sectional view of an IC package assembly including an IC package disposed on an IC package support structure, in accordance with various embodiments.

FIG. 5 is a side cross-sectional view of an IC package assembly 120 including IC packages 100-1 and 100-2 disposed on an IC package support structure 106, in accordance with various embodiments. The IC packages 100-1 and 100-2 may be formed in accordance with any of the IC packages 100 disclosed herein (e.g., including package substrates 111 having one or more temperature sensor traces 113). The IC package support structure 106 may have a first face 107 and a second face 105, and conductive contacts 110 may be disposed at the second face 105. The IC packages 100-1 and 100-2 may be BGA packages and may include conductive contacts 102-1 and 102-2, respectively, that are coupled to conductive contacts 110-1 and 110-2 of the second face 105 of the IC package support structure 106 via solder 104-1 and 104-2, respectively.

The IC package support structure 106 may include one or more heater traces 114. The heater traces 114 of the IC package support structure 106 may be arranged such that, when power is selectively conducted through one or more of the heater traces 114, the heater traces 114 generate heat to cause the solder 104-1 or 104-2 disposed on the conductive contacts 110-1 or 110-2 to melt, enabling the attachment and/or detachment of the IC package 100-1 or 100-2. Different ones of the heater traces 114 (e.g., the heater traces 114-1, 114-2, and 114-3) may be provided with power to melt solder 104 disposed on different groupings of the conductive contacts 110; for example, the heater traces 114 may generate heat to melt the solder 104-1 disposed on the conductive contacts 110-1, but not the solder 104-2 disposed on the conductive contacts 110-2, or vice versa.

The heat generated by the heater traces 114 may particularly heat vias in the IC package support structure 106 that couple to the conductive contacts 110, thereby heating the conductive contacts 110. In FIG. 5, the IC package support structure 106 includes heater traces 114-1, 114-2, and 114-3, but the specific number of heater traces 114 shown in FIG. 5 is simply illustrative, and more or fewer heater traces 114 may be included in the IC package support structure 106. Additionally, the specific arrangement of heater traces 114 shown in FIG. 5 is simply illustrative, and any suitable arrangement may be used. The amount of power provided to the heater traces 114 to melt the solder 104 on a particular set of conductive contacts 110 may depend on the particular temperature to be achieved to melt the solder 104 (which may depend on the solder material), the arrangement of the heater traces 114, and thermal constraints on other portions of the IC package support structure 106 (e.g., other conductive contacts 110 having solder 104 that is not to be melted), for example.

In some embodiments, the IC package support structure 106 may include one or more temperature sensor traces 112. In FIG. 5, the IC package support structure 106 includes temperature sensor traces 112-1 and 112-2. The temperature sensor traces 112 of the IC package support structure 106 may take the form of any of the embodiments of the temperature sensor traces 113 of the IC package 100 discussed herein. In some embodiments, the temperature data provided by the resistance of the temperature sensor traces 112 may be used by the heater control device 130 when providing power to the heater traces 114 in order to achieve particular temperatures at one or more locations in the IC package support structure 106. For example, the temperature sensor traces 112 of the IC package support structure 106 may be used to measure the equivalent temperature near the conductive contacts 110, and that temperature may be provided to a feedback loop in the heater control device 130 (discussed below with reference to FIGS. 8 and 9) to control the amount of power provided to the heater traces 114 to achieve a desired solder melting temperature at the conductive contacts 110. The "amount" of power may be the duty cycle settings of a pulse width modulated (PWM) current signal, the DC value of a current signal, or a combination thereof, for example.

The feedback loop may also be used to ensure that other portions of the IC package support structure 106 do not exceed a maximum temperature and/or the temperature across the IC package support structure 106 is relatively uniform to mitigate any mechanical failures that may occur as a result of thermal expansion mismatches. The specific number of temperature sensor traces 112 shown in FIG. 5 is simply illustrative, and more or fewer temperature sensor traces 112 may be included in an IC package support structure 106. Additionally, the specific arrangement of temperature sensor traces 112 shown in FIG. 5 is simply illustrative, and any suitable arrangement may be used. In some embodiments, no temperature sensor traces 112 may be included in the IC package support structure 106.

The IC package support structure 106 may include multiple layers 108. One or more of these layers 108 may include one or more heater traces 114 and/or temperature sensor traces 112. For example, in the embodiment illustrated in FIG. 5, the layer 108-2 includes two temperature sensor traces 112-1 and 112-2, the layer 108-4 includes two heater traces 114-1 and 114-2, and the layer 108-8 includes a heater trace 114-3. Different layers including heater traces 114 and/or temperature sensor traces 112 may be spaced apart by insulator layers (e.g., the layers 108-3, 108-5, and 108-7 of FIG. 5). Some of the layers 108 may be metal layers that include electrical signal routing traces, and some of the layers 108 may be insulator layers (e.g., formed of a dielectric material) that include vias to electrically couple different metal layers, as known in the art. For example, the layer 108-1 may be an insulator layer that includes vias (not shown) to route electrical signals to/from the conductive contacts 110, and the layer 108-9 may be an insulator layer that includes vias (not shown) to route electrical signals to/from other conductive contacts (e.g., the conductive contacts 118 discussed below with reference to FIG. 6). Electrical signal routing traces and vias are not shown in FIG. 5 for ease of illustration, and may be formed in accordance with any technique known in the art. In some embodiments, the IC package support structure 106 may include multiple metal layers separated from one another by layers of dielectric material and interconnected by electrically conductive vias. Any one or more of the metal layers may be formed in a desired circuit pattern of signal routing traces to route electrical signals (optionally in conjunction with other metal layers) between the components of the IC package support structure 106. In some embodiments, a layer 108 of the IC package support structure 106 may include both electrical signal routing traces and one or more heater traces 114 and/or temperature sensor traces 112, while in other embodiments, electrical signal routing traces, heater traces 114, and/or temperature sensor traces 112 may be segregated in different layers 108.

In some embodiments, the IC package support structure 106 may include one or more metal planes 115. For example, FIG. 5 illustrates a metal plane 115-1 that spans all of the layer 108-6, and a metal plane 115-2 that "shares" the layer 108-8 with the heater trace 114-3. The metal planes 115 included in the IC package support structure 106 may act as heat spreaders and may help to achieve a uniform temperature profile across the IC package support structure 106. As noted above, a uniform temperature profile may reduce the likelihood of cracking, delamination, or other mechanical failures that may arise as a result of mismatches in the coefficient of thermal expansion between different materials included in the IC package assembly 120. The metal planes 115 included in the IC package support structure 106 may include holes (not shown) through which vias may extend (and from which the vias may be electrically insulated) as part of the electrical signaling network in the IC package support structure 106.

In some embodiments, the heater traces 114 and/or the temperature sensor traces 112 in the IC package support structure 106 may have connection terminals (not shown) exposed at a surface of the IC package support structure 106 at which a heater control device 130 (discussed below with reference to FIGS. 8 and 9) may make electrical contact with the heater traces 114 (to provide power to the heater traces 114 to cause the heater traces 114 to generate heat) and/or with the temperature sensor traces 112 (to measure their electrical resistance and determine their equivalent temperatures).

The IC package support structure 106 may be formed of an epoxy resin, a fiberglass-reinforced epoxy resin, a ceramic material, or a polymer material such as polyimide. In some implementations, the IC package support structure 106 may be formed of alternate rigid or flexible materials, such as silicon, germanium, and other group III-V and group IV materials. The IC package support structure 106 may include metal interconnects and vias (not shown), including but not limited to through-silicon vias (TSVs). The IC package support structure 106 may further include embedded devices (not shown), including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio-frequency (RF) devices, power amplifiers, power management devices, antennas, arrays, sensors, and microelectromechanical systems (MEMS) devices may also be formed on the IC package support structure 106.

Figure 6:
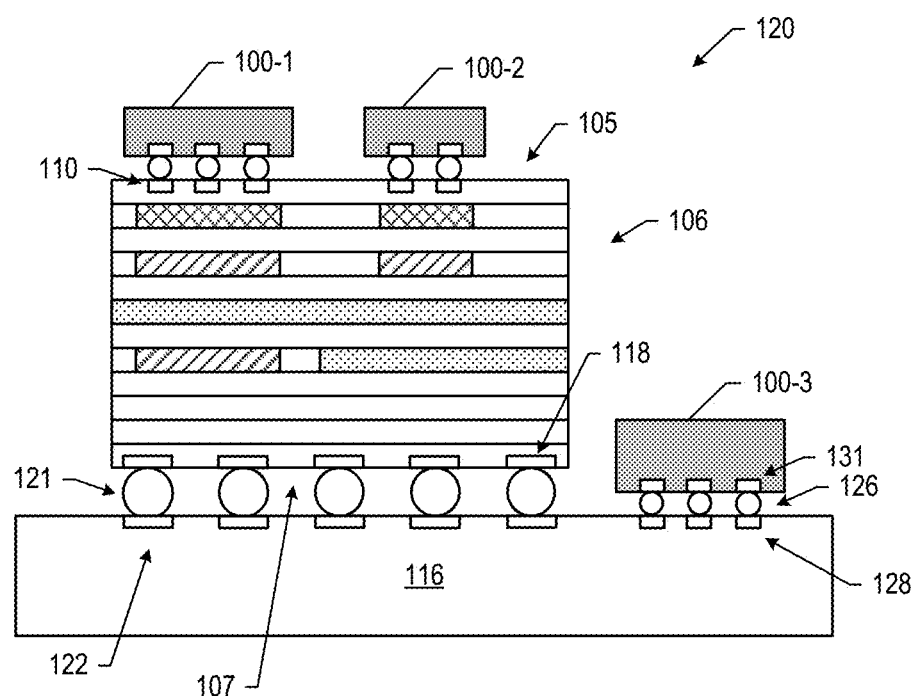
FIG. 6 is a side cross-sectional view of an embodiment of the IC package assembly of FIG. 5 in which the IC package support structure is an interposer, in accordance with various embodiments.

In some embodiments, the IC package support structure 106 may take the form of an interposer. For example, FIG. 6 is a side cross-sectional view of an embodiment of the IC package assembly 120 of FIG. 5 in which the IC package support structure 106 is an interposer, in accordance with various embodiments. The IC package support structure 106 may include conductive contacts 118 disposed at a first face 107 of the IC package support structure 106, and the conductive contacts 110 may be disposed at a second face 105 of the IC package support structure. The conductive contacts 118 may be coupled to conductive contacts 122 of a PCB 116 via solder 121, and the conductive contacts 110 may be coupled to the IC packages 100, as discussed above with reference to FIG. 5. Additional IC packages, such as the IC package 100-3 of FIG. 6, may be coupled to the PCB 116. The IC package 100-3 may take the form of any of the IC packages 100 disclosed herein and may include conductive contacts 131 coupled to conductive contacts 128 of the PCB 116 via solder 126. In some embodiments, the PCB 116 may be a motherboard or other suitable substrate. The IC package support structure 106 of FIG. 6 may include electrical signal routing traces and vias arranged to route electrical signals between the conductive contacts 110 and the conductive contacts 122 via the conductive contacts 118. The components of the IC package support structure 106 of FIG. 6 may take the form of any of the embodiments of the IC package support structure 106 discussed above with reference to FIG. 5.

Figure 7:
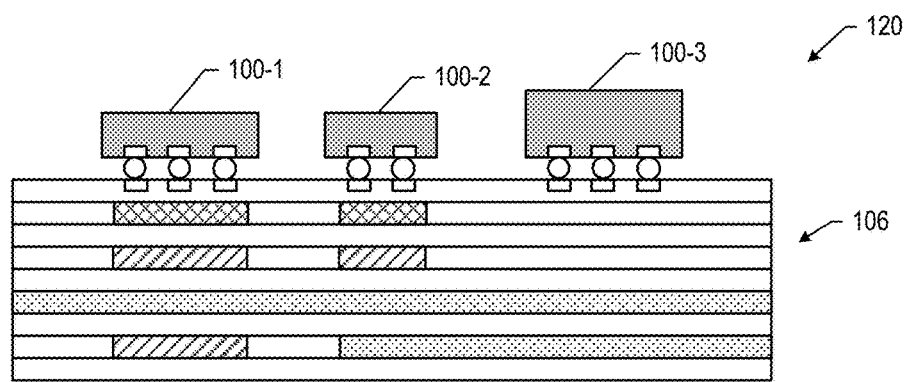
FIG. 7 is a side cross-sectional view of an embodiment of the IC package assembly of FIG. 5 in which the IC package support structure is a printed circuit board (PCB), in accordance with various embodiments.

In some embodiments, the IC package support structure 106 may take the form of a PCB (e.g., a motherboard). FIG. 7 is a side cross-sectional view of an embodiment of the IC package assembly 120 of FIG. 5 in which the IC package support structure 106 is a PCB having the IC packages 100-1, 100-2, and 100-3 disposed thereon, in accordance with various embodiments. The components of the IC package support structure 106 of FIG. 7 may take the form of any of the embodiments of the IC package support structure 106 discussed above with reference to FIG. 5.

Figure 8:
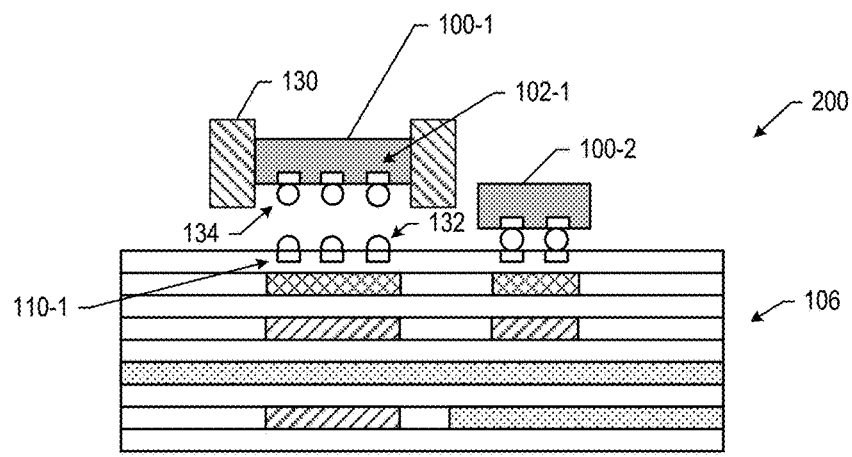
FIG. 8 is a side cross-sectional view of an assembly subsequent to bringing a heater control device and an IC package in proximity to the IC package support structure of FIG. 5, in accordance with various embodiments.

As noted above, the heater traces 114 included in the IC package support structure 106 may be used to facilitate the attachment and detachment of one or more of the IC packages 100 from the IC package support structure 106. FIG. 8 is a side cross-sectional view of an assembly 200 subsequent to bringing a heater control device 130 and an IC package 100-1 in proximity to the IC package support structure 106 of FIG. 5, in accordance with various embodiments. In some embodiments, the heater control device 130 may include a mechanical clamp or other structure to hold the IC package 100-1, and may also include alignment features (e.g., alignment corners, pins) to facilitate the alignment of the heater control device 130 (while holding the IC package 100-1) into a desired position on the IC package support structure 106. Solder balls 134 may be disposed on the conductive contacts 102-1 of the IC package 100-1, and solder paste 132 may be disposed on the conductive contacts 110-1. Proper alignment of the heater control device 130 (and IC package 100-1) with the IC package support structure 106 may align the conductive contacts 102-1 with corresponding conductive contacts 110-1, may align heater trace contacts (not shown) of the heater control device 130 with connection terminals (not shown) of the heater traces 114, and may align temperature sensor trace contacts (not shown) of the heater control device 130 with connection terminals (not shown) of the temperature sensor traces 112.

Figure 9:
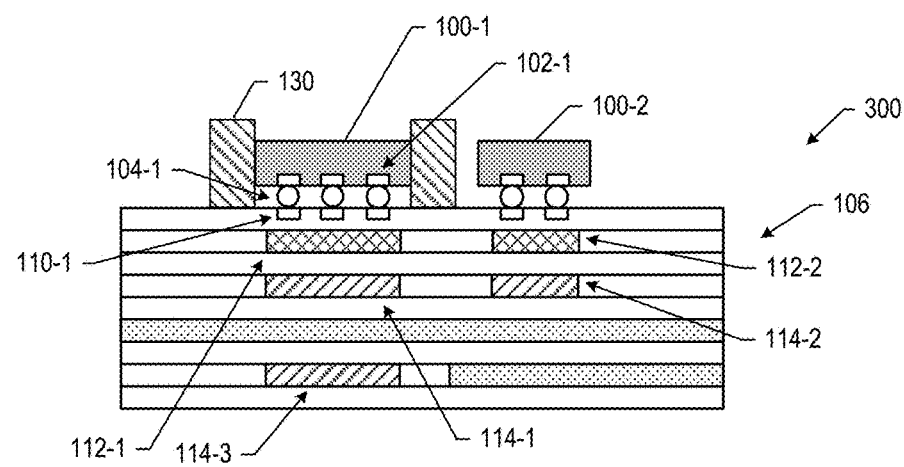
FIG. 9 is a side cross-sectional view of an assembly subsequent to using the heater control device of FIG. 8 to couple the IC package to the IC package support structure, in accordance with various embodiments.

FIG. 9 is a side cross-sectional view of an assembly 300 subsequent to using the heater control device 130 of FIG. 8 to couple the IC package 100-1 to the IC package support structure 106, in accordance with various embodiments. In particular, once the heater control device 130 and the IC package 100-1 are properly aligned with the IC package support structure 106, the heater control device 130 may cause power to be dissipated in the heater traces 114 of the IC package support structure 106 to melt the solder balls 134 and the solder paste 132 to conductively couple the conductive contacts 102-1 of the IC package 100-1 to the conductive contacts 110-1 of the IC package support structure 106. As discussed above, in some embodiments, the heater control device 130 may use temperature feedback from the temperature sensor traces 112 to adjust the amount of power provided to the heater traces 114 to achieve a desired temperature profile in the IC package support structure 106. Once the solder balls 134 and the solder paste 132 have achieved desired reflow conditions, the heater control device 130 may allow the heater traces 114 to cool, thereby allowing the newly formed solder connections 104 between the conductive contacts 102-1 and the conductive contacts 110-1 to solidify. The heater control device 130 may then disengage from the IC package 100-1 and the IC package support structure 106.

If the IC package 100-1 is to be detached from the IC package support structure 106, an analogous procedure may be performed: the heater control device 130 may be brought into alignment with the IC package 100-1 and the IC package support structure 106, power may be selectively provided to the heater traces 114 to cause the solder 104-1 to melt, and the IC package 100-1 may be removed.

In some embodiments, the heater control device 130 may be temporarily coupled to the IC package 100-1, and may be disengaged from the IC package 100-1 when attachment/detachment of the IC package 100-1 is not underway. For example, the heater control device 130 may be a reusable, modular device that can be used in the field or in a factory setting. Such a heater control device 130 may be designed for use with one particular IC package design or may be usable with multiple different IC package designs. In other embodiments, the heater control device 130 may be permanently coupled to the IC package 100-1. In some embodiments, the heater control device 130 may be temporarily coupled to the IC package support structure 106 and may be disengaged from the IC package support structure 106 when attachment/detachment of the IC package 100-1 is not underway. In other embodiments, the heater control device 130 may be permanently coupled to the IC package support structure 106.

In some embodiments, the heater control device 130 may include its own power source to drive the heater traces 114, while in other embodiments, the heater control device 130 may utilize a power source included in the IC package support structure 106 or the PCB 116.

By facilitating the attachment/detachment of the IC package 100-1, the IC package support structure 106 may improve on conventional attachment methodologies. Such conventional attachment methodologies include conventional BGA attachment, in which an IC package is soldered to a component. Conventional BGA attachment typically exhibits high reliability and good high-speed signaling performance, but must be reworked in a controlled factory setting with specialized equipment and training, and therefore BGA packages are not readily attached and detached during testing or in the field. Another example of a conventional attachment methodology is a land grid array (LGA), in which an IC package is fitted into a socket. IC packages with LGA connections are readily attached and detached, but LGA sockets are prone to damage (and are themselves not readily replaced), and may exhibit poor high-speed signal performance (e.g., by adding impedance and cross talk to the signal chain). Another example of a conventional attachment methodology is metal particle interconnect (MPI), another socket methodology. Conventional MPI sockets are too expensive to be suited for high-volume production, and may add impedance to the signal chain.

The IC package support structure 106 may provide the advantages of conventional BGA attachment by facilitating a direct solder connection between the IC package support structure 106 and the IC package 100-1, while facilitating easy attachment/detachment by the use of the heater traces 114 (achieving or surpassing the ease of sockets). When the heater control device 130 is a modular component, a technician in the factory or field can readily install or replace the IC package 100-1.

The temperature sensor traces 113 of the IC package 100 may be used in an IC package temperature monitoring system 150 to monitor and/or control the temperature of the IC package 100 to improve performance. FIG. 10 is a block diagram of an IC package temperature monitoring system 150, in accordance with various embodiments. The system 150 may include one or more temperature sensor traces 113 and the IC die 103 of the IC package 100. A temperature sensor trace 113 of the IC package 100 may be coupled to a temperature determination device 170. The temperature determination device 170 may be configured to measure the resistance of the temperature sensor trace 113 and thereby determine the equivalent temperature of the temperature sensor trace 113, as discussed above. In some embodiments, the temperature determination device 170 may be included in the IC package 100 (e.g., coupled to the package substrate 111). In other embodiments, the temperature determination device 170 may be included in a component to which the IC package 100 is coupled, such as the IC package support structure 106, a PCB, an interposer, or any other component. In some embodiments, the temperature determination device 170 may output digital or analog data representative of the equivalent temperature of the temperature sensor trace 113. The implementation of the temperature determination device 170 may take the form of any temperature determination devices known in the art (e.g., a programmed microcontroller), and thus is not discussed in further detail herein.

The temperature determination device 170 may be coupled to a thermal management device 172. The thermal management device 172 may be configured to receive the equivalent temperature of the temperature sensor trace 113 from the temperature determination device 170 and control the operation of the IC die 103 based on the equivalent temperature. For example, in some embodiments, the thermal management device 172 may shut down the IC die 103 if the temperature determination device 170 indicates that the temperature of a monitored portion of the IC package 100 exceeds a temperature threshold for reliable operation. In some embodiments, the thermal management device 172 may power up the IC die 103 if the temperature determination device 170 indicates that the temperature of a monitored portion of the IC package 100 does not exceed a temperature threshold for reliable operation. In some embodiments, the thermal management device 172 may control the operation of the IC die 103 at more levels of resolution than "on" and "off"; for example, the thermal management device 172 may adjust the power state of the IC die 103 between three or more states based on the equivalent temperature from the temperature determination device 170. References to "the equivalent temperature" in the singular when discussing the operation of the thermal management device 172 are simply for ease of illustration, and the thermal management device 172 may receive multiple equivalent temperatures from the temperature determination device 170 (from corresponding multiple temperature sensor traces 113), and may make control decisions for the IC die 103 based on these multiple equivalent temperatures. In some embodiments, the thermal management device 172 may be included in the IC package 100 (e.g., coupled to the package substrate 111). In other embodiments, the thermal management device 172 may be included in a component to which the IC package 100 is coupled, such as the IC package support structure 106, a PCB, an interposer, or any other component. The implementation of the thermal management device 172 may take the form of any thermal management devices known in the art (e.g., a programmed microcontroller), and thus is not discussed in further detail herein.

Figure 11:
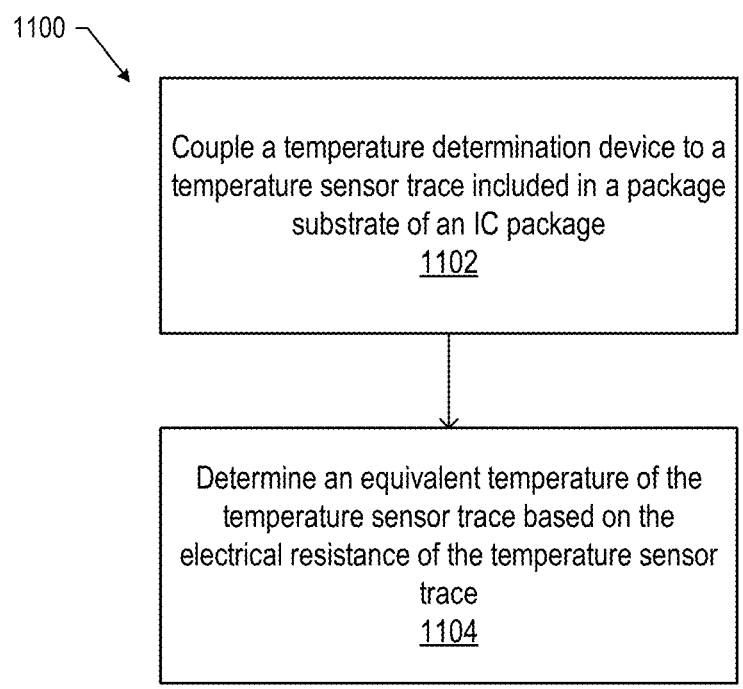
FIG. 11 is a flow diagram of a method of monitoring temperature in an IC package, in accordance with various embodiments.

FIG. 11 is a flow diagram of a method 1100 of monitoring temperature in an IC package, in accordance with various embodiments. While the operations of the method 1100 are arranged in a particular order in FIG. 11 and illustrated once each, in various embodiments, one or more of the operations may be repeated or performed in parallel (e.g., when the equivalent temperature of a temperature sensor trace 113 is continuously monitored). Operations discussed below with reference to the method 1100 may be illustrated with reference to the IC package 100 in the IC package temperature monitoring system 150 of FIG. 10, but this is simply for ease of discussion, and the method 1100 may be used to monitor the temperature of any suitable IC package.

At 1102, a temperature determination device may be coupled to a temperature sensor trace included in a package substrate of an IC package. For example, the temperature determination device 170 may be coupled to the temperature sensor trace 113 included in the package substrate 111 of the IC package 100. In some embodiments, the coupling at 1102 may be a temporary coupling or a permanent coupling. In some embodiments, the coupling at 1102 may occur by powering on the temperature determination device.

At 1104, an equivalent temperature of the temperature sensor trace of 1102 may be determined based on the electrical resistance of the temperature sensor trace. For example, the temperature determination device 170 may determine the equivalent temperature of the temperature sensor trace 113 based on the logical resistance of the temperature sensor trace 113.

In some embodiments, the method 1100 may further include coupling the temperature determination device to a second temperature sensor trace included in the package substrate and determining an equivalent temperature of the second temperature sensor trace based on an electrical resistance of the second temperature sensor trace. In such an embodiment, the different temperature sensor traces may be included in a same layer of the IC substrate or in different layers. In some embodiments, the method 1100 may further include providing the equivalent temperature determined at 1104 to a thermal management device. In some such embodiments, the thermal management device may be configured to determine, based on the equivalent temperature, whether to shut down or power up a processing device included in the IC package.

Figure 12:
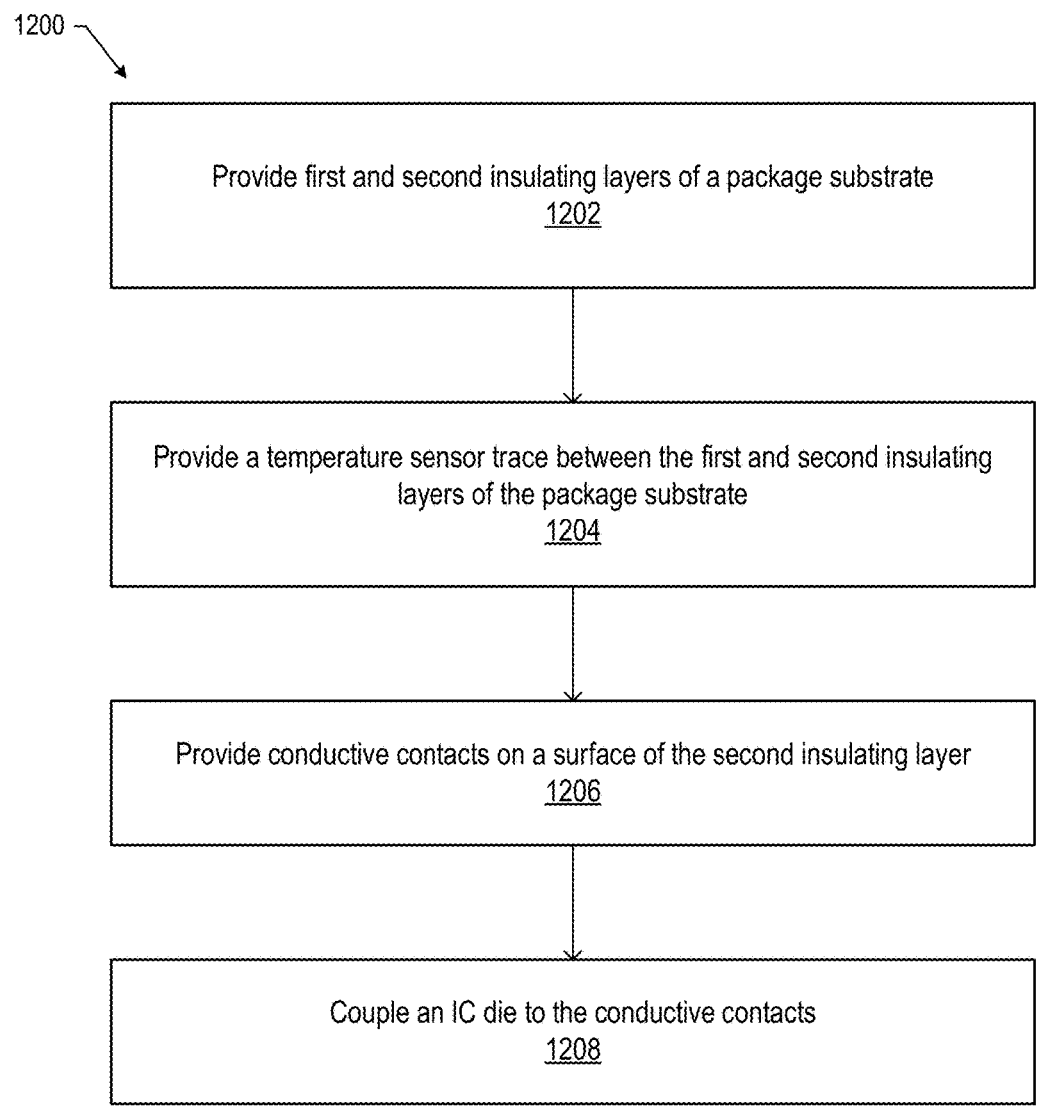
FIG. 12 is a flow diagram of a method of manufacturing an IC package, in accordance with various embodiments.

FIG. 12 is a flow diagram of a method 1200 of manufacturing an IC package, in accordance with various embodiments. While the operations of the method 1200 are arranged in a particular order in FIG. 12 and illustrated once each, in various embodiments, one or more of the operations may be repeated or performed in parallel (e.g., when multiple IC packages are being manufactured). Operations discussed below with reference to the method 1200 may be illustrated with reference to the IC package 100 of FIG. 1, but this is simply for ease of discussion, and the method 1200 may be used to manufacture any suitable IC package.

At 1202, first and second insulating layers of a package substrate may be provided. For example, the insulating layer 109-1 and the insulating layer 109-5 of the package substrate 111 may be provided as part of a package substrate manufacturing procedure, as known in the art.

At 1204, a temperature sensor trace may be provided between the first and second insulating layers of the package substrate. For example, a temperature sensor trace 113 (e.g., any of the temperature sensor traces 113-1, 113-2, and 113-3 of FIG. 1) may be provided between the insulating layer 109-1 and the insulating layer 109-5 of the package substrate 111. The operations discussed above with reference to 1202 and 1204 may be performed as part of a package substrate manufacturing procedure wherein different layers of the package substrate are formed in sequence. In particular, the provision of the first and second insulating layers at 1202 may not occur before the provision of the temperature sensor trace; instead, one of the insulating layers may be provided, the temperature sensor trace may be subsequently provided, and the other of the insulating layers may be subsequently provided.

At 1206, conductive contacts may be provided on a surface of the second insulating layer. For example, the conductive contacts 197 may be provided on the insulating layer 109-1.

At 1208, an IC die may be coupled to the conductive contacts. For example, the IC die 103 may be coupled to the conductive contacts 197 (e.g., via the solder 199).

Figure 13:
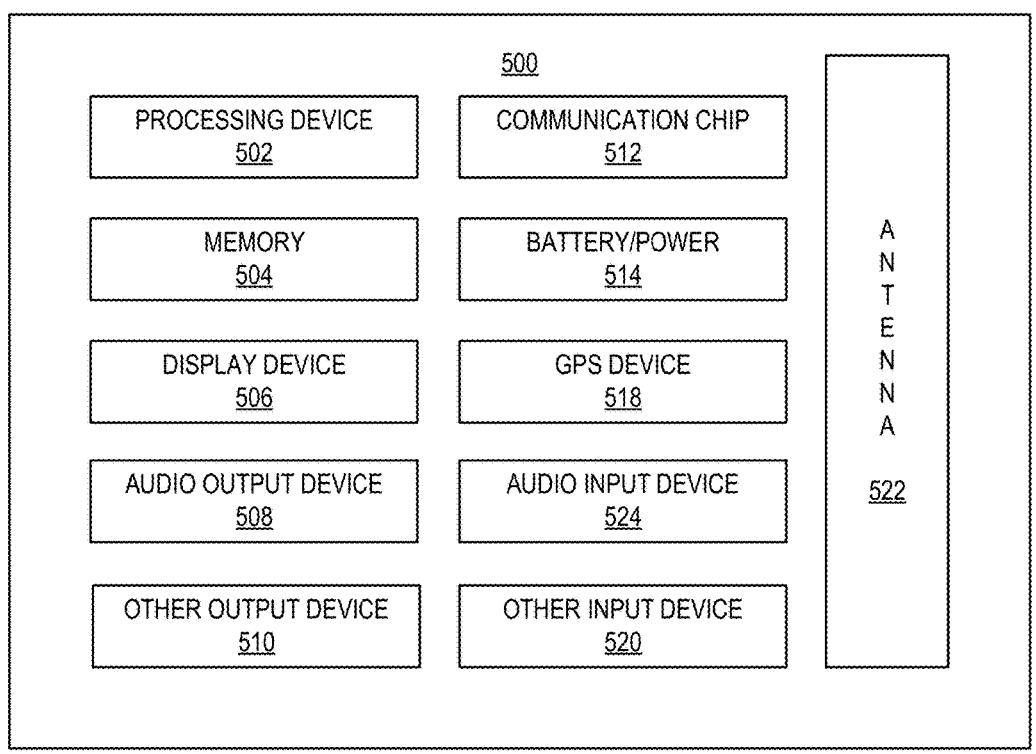
FIG. 13 is a block diagram of an example computing device that may include an IC package in accordance with the teachings of the present disclosure.

FIG. 13 is a block diagram of an example computing device 500 that may include an IC package 100 in accordance with the teachings of the present disclosure. In particular, any of the components of the computing device 500 that may be implemented at least partially in an IC package may include the IC package 100. A number of components are illustrated in FIG. 13 as included in the computing device 500, but any one or more of these components may be omitted or duplicated, as suitable for the application. In some embodiments, some or all of the components included in the computing device 500 may be attached to one or more motherboards (e.g., the PCB 116). In some embodiments, some or all of these components are fabricated onto a single system-on-a-chip (SoC) die (e.g., the IC die 103).

Additionally, in various embodiments, the computing device 500 may not include one or more of the components illustrated in FIG. 13, but the computing device 500 may include interface circuitry for coupling to the one or more components. For example, the computing device 500 may not include a display device 506, but may include display device interface circuitry (e.g., a connector and driver circuitry) to which a display device 506 may be coupled. In another set of examples, the computing device 500 may not include an audio input device 524 or an audio output device 508, but may include audio input or output device interface circuitry (e.g., connectors and supporting circuitry) to which an audio input device 524 or audio output device 508 may be coupled. Any one or more of the components of the computing device 500 may include one or more IC packages 100.

The computing device 500 may include a processing device 502 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 502 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. In some embodiments, the processing device 502 may be included in the IC die 103 in the IC package 100. The computing device 500 may include a memory 504, which may itself include one or more memory devices such as volatile memory (e.g., dynamic random access memory (DRAM)), non-volatile memory (e.g., read-only memory (ROM)), flash memory, solid state memory, and/or a hard drive. In some embodiments, the memory 504 may include memory that shares a die with the processing device 502. This memory may be used as cache memory and may include embedded DRAM (eDRAM) or spin transfer torque magnetic RAM (STT-MRAM). The memory 504 may be included in the IC package 100.

In some embodiments, the computing device 500 may include a communication chip 512 (e.g., one or more communication chips). For example, the communication chip 512 may be configured for managing wireless communications for the transfer of data to and from the computing device 500. The term "wireless" and its derivatives may be used to describe circuits, devices, systems, methods, techniques, communication channels, etc., that may communicate data through the use of modulated electromagnetic radiation through a nonsolid medium. The term does not imply that the associated devices do not contain any wires, although in some embodiments they might not. The communication chip 512 may be included in the IC package 100.

The communication chip 512 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 512 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 512 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 512 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 512 may operate in accordance with other wireless protocols in other embodiments. The computing device 500 may include an antenna 522 to facilitate wireless communications and/or to receive other wireless communications (such as AM or FM radio transmissions).

In some embodiments, the communication chip 512 may manage wired communications, such as electrical, optical, or any other suitable communication protocols (e.g., the Ethernet). As noted above, the communication chip 512 may include multiple communication chips. For instance, a first communication chip 512 may be dedicated to shorter-range wireless communications such as Wi-Fi or Bluetooth, and a second communication chip 512 may be dedicated to longer-range wireless communications such as GPS, EDGE, GPRS, CDMA, WiMAX, LTE, EV-DO, or others. In some embodiments, a first communication chip 512 may be dedicated to wireless communications, and a second communication chip 512 may be dedicated to wired communications.

The computing device 500 may include battery/power circuitry 514. The battery/power circuitry 514 may include one or more energy storage devices (e.g., batteries or capacitors) and/or circuitry for coupling components of the computing device 500 to an energy source separate from the computing device 500 (e.g., AC line power).

The computing device 500 may include a display device 506 (or corresponding interface circuitry, as discussed above). The display device 506 may include any visual indicators, such as a heads-up display, a computer monitor, a projector, a touchscreen display, a liquid crystal display (LCD), a light-emitting diode display, or a flat panel display, for example.

The computing device 500 may include an audio output device 508 (or corresponding interface circuitry, as discussed above). The audio output device 508 may include any device that generates an audible indicator, such as speakers, headsets, or earbuds, for example.

The computing device 500 may include an audio input device 524 (or corresponding interface circuitry, as discussed above). The audio input device 524 may include any device that generates a signal representative of a sound, such as microphones, microphone arrays, or digital instruments (e.g., instruments having a musical instrument digital interface (MIDI) output).

The computing device 500 may include a global positioning system (GPS) device 518 (or corresponding interface circuitry, as discussed above). The GPS device 518 may be in communication with a satellite-based system and may receive a location of the computing device 500, as known in the art.

The computing device 500 may include an other output device 510 (or corresponding interface circuitry, as discussed above). Examples of the other output device 510 may include an audio codec, a video codec, a printer, a wired or wireless transmitter for providing information to other devices, or an additional storage device.

The computing device 500 may include an other input device 520 (or corresponding interface circuitry, as discussed above). Examples of the other input device 520 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 500 may have any desired form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultra-mobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 500 may be any other electronic device that processes data.

The following paragraphs provide various examples of the embodiments disclosed herein.

Example 1 is an integrated circuit (IC) package, including: a package substrate; and an IC die disposed on the package substrate; wherein the package substrate includes a temperature sensor trace, and an electrical resistance of the temperature sensor trace is representative of an equivalent temperature of the temperature sensor trace.

Example 2 may include the subject matter of Example 1, and may further specify that the temperature sensor trace is a first temperature sensor trace, and the package substrate further includes a second temperature sensor trace.

Example 3 may include the subject matter of Example 2, and may further specify that the first and second temperature sensor traces are included in a same layer of the package substrate.

Example 4 may include the subject matter of Example 2, and may further specify that the first and second temperature sensor traces are included in different layers of the package substrate.

Example 5 may include the subject matter of Example 4, and may further specify that the package substrate further includes a third temperature sensor trace included in a same layer of the package substrate as the first temperature sensor trace.

Example 6 may include the subject matter of any of Examples 1-5, and may further specify that the temperature sensor trace is disposed between insulating layers in the package substrate.

Example 7 may include the subject matter of any of Examples 1-6, and may further specify that the IC die includes a central processing unit (CPU).

Example 8 may include the subject matter of any of Examples 1-7, and may further include a temperature determination device conductively coupled to the temperature sensor trace to determine the equivalent temperature of the temperature sensor trace based on the electrical resistance of the temperature sensor trace.

Example 9 may include the subject matter of Example 8, and may further specify that the temperature determination device is to provide data representative of the equivalent temperature to a thermal management device.

Example 10 is an integrated circuit (IC) package assembly, including: an IC package including a package substrate and an IC die disposed on the package substrate, wherein the package substrate includes a temperature sensor trace, and wherein an electrical resistance of the temperature sensor trace is representative of an equivalent temperature of the temperature sensor trace; and an IC package support structure including a heater trace, wherein the IC package is disposed on the IC package support structure.

Example 11 may include the subject matter of Example 10, and may further specify that the IC package support structure includes conductive contacts, solder is disposed on the conductive contacts to couple the IC package to the IC package support structure, and, when power is dissipated in the heater trace, the heater trace is to generate heat to cause the solder disposed on the conductive contacts to melt.

Example 12 may include the subject matter of any of Examples 10-11, and may further specify that the temperature sensor trace is a first temperature sensor trace, the package substrate further includes a second temperature sensor trace, and the first temperature sensor trace is disposed between the IC package support structure and the second temperature sensor trace.

Example 13 may include the subject matter of any of Examples 10-12, and may further specify that the IC package support structure is a motherboard.

Example 14 may include the subject matter of any of Examples 10-12, and may further specify that the IC package support structure is an interposer.

Example 15 may include the subject matter of Example 14, and may further include a printed circuit board (PCB) coupled to the IC package support structure such that the IC package support structure is disposed between the PCB and the IC package.

Example 16 may include the subject matter of Example 15, and may further specify that the PCB is a motherboard.

Example 17 may include the subject matter of any of Examples 10-16, and may further include a temperature determination device conductively coupled to the temperature sensor trace to determine the equivalent temperature of the temperature sensor trace based on the electrical resistance of the temperature sensor trace; and provide the equivalent temperature to a thermal management device.

Example 18 may include the subject matter of Example 17, and may further specify that the IC die includes a processing device, and the IC package assembly further includes the thermal management device, wherein the thermal management device is to receive the equivalent temperature and determine whether to shut down the processing device based on the equivalent temperature.

Example 19 may include the subject matter of Example 18, and may further specify that the thermal management device is disposed on the IC package support structure.

Example 20 may include the subject matter of Example 19, and may further specify that the thermal management device is included in a printed circuit board (PCB) on which the IC package support structure is disposed.

Example 21 is a method of monitoring temperature in an integrated circuit (IC) package, including: coupling a temperature determination device to a temperature sensor trace included in a package substrate of the IC package; and determining an equivalent temperature of the temperature sensor trace based on an electrical resistance of the temperature sensor trace.

Example 22 may include the subject matter of Example 21, and may further specify that the temperature sensor trace is a first temperature sensor trace, and the method further includes: coupling the temperature determination device to a second temperature sensor trace included in the package substrate; and determining an equivalent temperature of the second temperature sensor trace based on an electrical resistance of the second temperature sensor trace.

Example 23 may include the subject matter of Example 22, and may further specify that the first and second temperature sensor traces are included in different layers of the package substrate.

Example 24 may include the subject matter of any of Examples 21-23, and may further include providing the equivalent temperature to a thermal management device, wherein the thermal management device is to determine, based on the equivalent temperature, whether to shut down a processing device included in the IC package.

Example 25 is a method of manufacturing an integrated circuit (IC) package, including: providing first and second insulating layers of a package substrate; providing a temperature sensor trace between the first and second insulating layers of the package substrate; providing conductive contacts on a surface of the second insulating layer; and coupling an IC die to the conductive contacts.

Example 26 may include the subject matter of Example 25, and may further include disposing a heat spreader on the IC die and the package substrate.

Example 27 is an apparatus including means for monitoring a temperature of an IC package.

What is claimed is:

1. An integrated circuit (IC) package, comprising:
    a package substrate; and
    an IC die disposed on the package substrate;
    wherein the package substrate includes a temperature sensor trace, and an electrical resistance of the temperature sensor trace is measurable by a temperature determination device to determine an equivalent temperature of the temperature sensor trace.

2. The IC package of claim 1, wherein the temperature sensor trace is disposed between insulating layers in the package substrate.

3. The IC package of claim 1, wherein the IC die includes a central processing unit (CPU).

4. The IC package of claim 1, further comprising:
    the temperature determination device, wherein the temperature determination is conductively coupled to the temperature sensor trace to determine the equivalent temperature of the temperature sensor trace based on the electrical resistance of the temperature sensor trace.

5. The IC package of claim 4, wherein the temperature determination device is to provide data representative of the equivalent temperature to a thermal management device.

6. The IC package of claim 1, wherein the temperature sensor trace is a first temperature sensor trace, and the package substrate further includes a second temperature sensor trace.

7. The IC package of claim 6, wherein the first and second temperature sensor traces are included in a same layer of the package substrate.

8. The IC package of claim 6, wherein the first and second temperature sensor traces are included in different layers of the package substrate.

9. The IC package of claim 8, wherein the package substrate further includes a third temperature sensor trace included in a same layer of the package substrate as the first temperature sensor trace.

10. An integrated circuit (IC) package assembly, comprising:
   an IC package including a package substrate and an IC die disposed on the package substrate, wherein the package substrate includes a temperature sensor trace, and wherein a temperature determination device, when conductive coupled to the temperature sensor trace, is to measure an electrical resistance of the temperature sensor trace and determine an equivalent temperature of the temperature sensor trace based on the electrical resistance; and
   an IC package support structure including a heater trace, wherein the IC package is disposed on the IC package support structure.

11. The IC package assembly of claim 10, wherein the IC package support structure includes conductive contacts, solder is disposed on the conductive contacts to couple the IC package to the IC package support structure, and, when power is dissipated in the heater trace, the heater trace is to generate heat to cause the solder disposed on the conductive contacts to melt.

12. The IC package assembly of claim 10, wherein the temperature sensor trace is a first temperature sensor trace, the package substrate further includes a second temperature sensor trace, and the first temperature sensor trace is disposed between the IC package support structure and the second temperature sensor trace.

13. The IC package assembly of claim 10, wherein the IC package support structure is a motherboard.

14. The IC package assembly of claim 10, wherein the IC package support structure is an interposer.

15. The IC package assembly of claim 14, further comprising:
   a printed circuit board (PCB) coupled to the IC package support structure such that the IC package support structure is disposed between the PCB and the IC package.

16. The IC package assembly of claim 15, wherein the PCB is a motherboard.

17. The IC package assembly of claim 10, further comprising:
   the temperature determination device, wherein the temperature determination device is conductively coupled to the temperature sensor trace, and the temperature determination device is to:
   determine the equivalent temperature of the temperature sensor trace based on the electrical resistance of the temperature sensor trace; and
   provide the equivalent temperature to a thermal management device.

18. The IC package assembly of claim 17, wherein the IC die includes a processing device, and the IC package assembly further comprises:
   the thermal management device, wherein the thermal management device is to receive the equivalent temperature and determine whether to shut down the processing device based on the equivalent temperature.

19. The IC package assembly of claim 18, wherein the thermal management device is disposed on the IC package support structure.

20. The IC package assembly of claim 19, wherein the thermal management device is included in a printed circuit board (PCB) on which the IC package support structure is disposed.

21. A method of monitoring temperature in an integrated circuit (IC) package, comprising:
   coupling a temperature determination device to a temperature sensor trace included in a package substrate of the IC package; and
   determining an equivalent temperature of the temperature sensor trace based on an electrical resistance of the temperature sensor trace.

22. The method of claim 21, wherein the temperature sensor trace is a first temperature sensor trace, and the method further comprises:
   coupling the temperature determination device to a second temperature sensor trace included in the package substrate; and
   determining an equivalent temperature of the second temperature sensor trace based on an electrical resistance of the second temperature sensor trace.

23. The method of claim 21, further comprising:
   providing the equivalent temperature to a thermal management device, wherein the thermal management device is to determine, based on the equivalent temperature, whether to shut down a processing device included in the IC package.

24. A method of manufacturing an integrated circuit (IC) package, comprising:
   providing first and second insulating layers of a package substrate;
   providing a temperature sensor trace between the first and second insulating layers of the package substrate, wherein an electrical resistance of the temperature sensor trace is measurable by a temperature determination device to determine an equivalent temperature of the temperature sensor trace;
   providing conductive contacts on a surface of the second insulating layer; and
   coupling an IC die to the conductive contacts.

25. The method of claim 24, further comprising:
   disposing a heat spreader on the IC die and the package substrate.

* * * * *

UNITED STATES PATENT AND TRADEMARK OFFICE
CERTIFICATE OF CORRECTION

PATENT NO. : 10,260,961 B2
APPLICATION NO. : 14/975938
DATED : April 16, 2019
INVENTOR(S) : Shelby Ferguson et al.

It is certified that error appears in the above-identified patent and that said Letters Patent is hereby corrected as shown below:

In the Claims

In Column 18, Line 64, in Claim 4, after "determination" insert -- device --.

Signed and Sealed this
Eighteenth Day of June, 2019

Andrei Iancu
*Director of the United States Patent and Trademark Office*